US009709647B2

(12) United States Patent  
Dewdney et al.

(10) Patent No.: US 9,709,647 B2  
(45) Date of Patent: Jul. 18, 2017

(54) MOBILE MAGNETIC RESONANCE TOMOGRAPHY

(71) Applicants: Andrew Dewdney, Neunkirchen am Brand (DE); Matthias Drobnitzky, Spardorf (DE); Ralf Ladebeck, Erlagen (DE)

(72) Inventors: Andrew Dewdney, Neunkirchen am Brand (DE); Matthias Drobnitzky, Spardorf (DE); Ralf Ladebeck, Erlagen (DE)

(73) Assignee: Siemens Aktiengesellschaft, München (DE)

( * ) Notice: Subject to any disclaimer, the term of this patent is extended or adjusted under 35 U.S.C. 154(b) by 599 days.

(21) Appl. No.: 14/276,508

(22) Filed: May 13, 2014

(65) Prior Publication Data

US 2014/0354277 A1    Dec. 4, 2014

(30) Foreign Application Priority Data

Jun. 3, 2013 (DE) .................. 10 2013 210 237

(51) Int. Cl.
*G01R 33/387* (2006.01)
*G01R 33/38* (2006.01)
(Continued)

(52) U.S. Cl.
CPC ....... *G01R 33/387* (2013.01); *G01R 33/3804* (2013.01); *G01R 33/389* (2013.01); *G01R 33/3875* (2013.01)

(58) Field of Classification Search
CPC .............. G01R 33/3875; G01R 33/389; G01R 33/3804
See application file for complete search history.

(56) References Cited

U.S. PATENT DOCUMENTS 6,788,060 B1   9/2004   Feenan et al.
6,825,667 B1   11/2004   Tsuda
(Continued)

FOREIGN PATENT DOCUMENTS

CN    1572243 A    2/2005
CN    200969054 Y  10/2007
(Continued)

OTHER PUBLICATIONS

German Office Action dated Oct. 11, 2013 in corresponding German Patent Application No. DE 10 2013 210 237.2 with English translation.
(Continued)

*Primary Examiner* — Gregory H Curran
(74) *Attorney, Agent, or Firm* — Lempia Summerfield Katz LLC

(57) ABSTRACT

A method for operating a mobile magnetic resonance tomography system having magnets and/or coils generating a magnetic field and a shield surrounding the magnets and/or coils is intended to enable an optimal image quality during the examination and at the same time have a small space requirement. For this purpose, a temperature is measured at a plurality of points on the shield by a temperature measuring system, where measured data of the temperature measuring system is sent to a compensation system, and where effects of temperature differences on the homogeneity of the magnetic field are compensated by the compensation system.

17 Claims, 1 Drawing Sheet

(51) Int. Cl.
*G01R 33/3875* (2006.01)
*G01R 33/389* (2006.01)

(56) References Cited

U.S. PATENT DOCUMENTS

| | | | |
|---|---|---|---|
| 2004/0169513 A1 | 9/2004 | Ham et al. | |
| 2007/0057754 A1 | 3/2007 | Wang et al. | |
| 2007/0120631 A1 | 5/2007 | Hobbs et al. | |
| 2009/0123139 A1* | 5/2009 | Seeber | G01R 33/389 |
| | | | 392/416 |
| 2011/0317393 A1* | 12/2011 | Drobnitzky | G01R 33/421 |
| | | | 361/818 |
| 2012/0001635 A1 | 1/2012 | Ookawa | |

FOREIGN PATENT DOCUMENTS

| | | |
|---|---|---|
| DE | 19702831 A1 | 3/1998 |
| GB | 2284058 A | 5/1995 |
| JP | H05161625 A | 6/1993 |
| JP | H05337098 A | 12/1993 |
| JP | 2000342554 A | 12/2000 |
| JP | 2002538862 A | 11/2002 |
| JP | 2006218141 A | 8/2006 |
| JP | 2007125384 A | 5/2007 |
| JP | 2012030051 A | 2/2012 |
| KR | 20130043024 A | 4/2013 |
| WO | WO9510786 A2 | 4/1995 |

OTHER PUBLICATIONS

Chinese Office Action for related Chinese Application No. 2014102423369 dated Jun. 23, 2016, with English Translation.
Japanese Notice of Allowance for related Japanese Application No. 2014-115055, dated Jun. 1, 2016.
Korean office Action for related Korean Application No. 10-2014-0065235 dated Aug. 9, 2016, with English Translation.
Chinese Office Action for related Chinese Application No. 2014 102 423 36.9 dated Feb. 21, 2017, with English Translation.

\* cited by examiner

MOBILE MAGNETIC RESONANCE TOMOGRAPHY

CROSS-REFERENCE TO RELATED APPLICATIONS

This application claims the benefit of DE 10 2013 210 237.2, filed on Jun. 3, 2013, which is hereby incorporated by reference in its entirety.

TECHNICAL FIELD

The embodiments relate to methods for operating a mobile magnetic resonance tomography system including magnets and/or coils generating a magnetic field and a shield surrounding the magnets and/or coils. The embodiments further relate to mobile magnetic resonance tomography systems.

BACKGROUND

Magnetic resonance tomography (MRT) enables sectional images (slices) of the human (or animal) body to be generated that permit an assessment of the organs and many pathological organ changes. MRT is based on very strong magnetic fields, generated in a magnetic resonance tomography (MRT) system, as well as on alternating magnetic fields in the radio frequency range by which specific atomic nuclei (mostly the hydrogen nuclei/protons) in the body are excited into resonance, thereby inducing an electrical signal in a receiver circuit.

MRT systems may be installed as stationary appliances. It is, however, also possible to install mobile MRT systems for example on trailers of heavy-duty motorized tractor vehicles, which may then be brought to the respective deployment location. Such mobile MRT systems require a stray magnetic field shield made of iron. Due to the constricted space conditions in trailers, the shield extends by reason of construction-related constraints two-dimensionally in the vertical walls over an area of approximately 30 m² and is closer to the magnets of the MRT system and less insulated from the outside world than in the case of stationary installations.

Since mobile MRT systems may be set up in the open, changing weather conditions lead to spatially and temporally widely varying amounts of heat being introduced into the iron shield. The change in temperature of the iron leads to a change in the susceptibility of the iron and consequently to a change in magnetization. This disrupts the homogeneity of the static magnetic field of the MRT system. Furthermore, the shielding iron expands as a result of its being heated, which likewise affects the homogeneity of the static magnetic field. Frequency shifts and image quality limitations during the MRT examination are the consequence.

Efforts have thus far been directed at attempting to realize a mounting of the iron shield that is largely decoupled mechanically and thermally from the trailer. Given a typical weight of several metric tons, this is problematic and only achievable with compromises. For this reason, additional heat insulation is normally provided in the external walls of the trailer to act as a thermal shield, e.g., in the form of panels made of synthetic organic foams having the lowest possible coefficient of heat transmission. In this case, however, consideration is given to the amount of space available. Therefore, the desired heat insulation is in contention with space requirements in the trailer as well as with the permissible external dimensions.

SUMMARY AND DESCRIPTION

The scope of the present invention is defined solely by the appended claims and is not affected to any degree by the statements within this summary. The present embodiments may obviate one or more of the drawbacks or limitations in the related art.

It is therefore the object of the embodiments to disclose a method for operating a mobile magnetic resonance tomography system as well as a mobile magnetic resonance tomography system that enable an optimal image quality during the examination at the same time as having a small space requirement.

With regard to the method, a temperature measurement is taken by a temperature measuring system at a plurality of points on the shield, where measured data of the temperature measuring system is sent to a compensation system, and where effects of temperature differences on the homogeneity of the magnetic field are compensated by the compensation system.

With regard to the magnetic resonance tomography system, the magnetic resonance tomography system includes a temperature measuring system having temperature measuring sensors arranged at a plurality of points on the shield, and a compensation system that is connected to the temperature measuring system on the measured data input side, where the compensation system is designed to compensate for effects of temperature differences on the homogeneity of the magnetic field.

The embodiments proceed here from the consideration that the greatest possible homogeneity of the static magnetic field in the MRT system may be provided in order to achieve an optimal image quality. In order not to restrict the free space available for the MRT system, (e.g., on the trailer of a heavy-duty tractor unit), it is not likely in this case to achieve a complete thermal and mechanical insulation of the magnetic shield from the outside world. Rather, certain temperature differences are inevitably given. In a first act to restore the homogeneity of the magnetic field disrupted by the temperature differences in the shield, a precise knowledge of the temperature distribution may therefore be acquired. For this purpose, a temperature measuring system is provided that includes a plurality, (e.g., a two-digit number), of temperature measuring sensors distributed at different points of the shield. The temperatures measured here are forwarded to a compensation system in which a temperature profile may now be generated that enables a targeted compensation of the temperature fluctuations and their effects on the homogeneity of the magnetic field.

In an advantageous embodiment of the method, the temperature differences are equalized by a plurality of heating and/or cooling elements of the compensation system. For this purpose, the compensation system advantageously includes a plurality of corresponding heating and/or cooling elements. The idea in this case is to correctively adjust the local temperature differences, the profile of which was determined in the compensation system, by corresponding heating and/or cooling elements such that a homogeneous temperature distribution is achieved over the entire shield. By this protocol, the susceptibility and expansion of the shield are balanced out and therefore inhomogeneities in the magnetic field are minimized.

In this case, the highest measured temperature is advantageously determined in the compensation system and the temperature is brought to the highest measured temperature at all points. The compensation system is advantageously designed accordingly therefor. Regulating the temperature to the highest temperature measured on the shield affords the advantage that no cooling is necessary and cooling elements may be dispensed with. Instead, comparatively lower-cost and technically easier-to-implement heating elements are used, such as, e.g., heating foils or planar heating elements.

In a second alternative or additional advantageous embodiment of the method, a number of auxiliary coils of the compensation system are energized with electric current based on the measured temperatures. For this purpose, the compensation system advantageously includes a corresponding number of auxiliary coils to which electric current may be applied by the compensation system. Instead of equalizing the temperature variations themselves, or in addition thereto, it is possible to restore the homogeneity of the magnetic field directly using corresponding auxiliary coils, which are also referred to as shim coils. Shim coils are often present already in MRT systems for the purpose of compensating, e.g., for stray fields or structural tolerances. However, the currents acting on the coils are not set in the compensation system based on a complicated measurement of the magnetic field itself, but in this case use is specifically made of the fact that the spatial distribution of the temperatures directly correlates with a spatial distribution of the inhomogeneities of the magnetic field. The currents are therefore set directly on the basis of the measured temperature distribution, which enables a quick and effective possibility of compensating for inhomogeneities.

In another advantageous embodiment of the method, a frequency of a frequency generator for a transmit coil of the magnetic resonance tomography system is varied based on the measured temperatures. For this purpose, the magnetic resonance tomography system advantageously includes a frequency generator for a transmit coil, which frequency generator is connected on the data input side to the compensation system. Although inhomogeneities of the magnetic field may be compensated by the aforementioned method, the measures carried out, such as changing the temperature in the shield or overlaying additional fields of shim coils, may result in a shift in the field strength of the (now homogeneous) magnetic field overall. The shift involves a change in the Larmor frequency of the nuclear spins of the object that is to be examined, which provides that other frequencies of the transmit coil are required for the nuclear spin excitation. If the measured temperature shifts are passed on directly to the frequency generator, the shift may be directly compensated for by an adjustment of the excitation frequencies.

While a measurement is performed, the magnetic resonance tomography system is advantageously operated according to the described method, e.g., the MRT system is advantageously designed to compensate for the effects of temperature differences on the homogeneity of the magnetic field during the performance of a measurement. In other words, the compensation based on corresponding temperature adjustment of the shield and/or adjustment of the currents to the shim coils is performed continuously during the measurement. This enables changes in temperature occurring during an examination, e.g., due to spontaneous changes in incident solar radiation as a result of clearing cloud cover or the like, to be continuously compensated, thus further optimizing the image quality.

A mobile magnetic resonance tomography system is advantageously operated by the described method.

A motorized vehicle or motorized vehicle trailer is advantageously equipped with a magnetic resonance tomography system.

The advantages achieved include that the image quality in mobile MRT systems is considerably improved as a result of the compensation of inhomogeneities of the magnetic field in an MRT system by temperature regulation or appropriate shimming. Influences affecting the magnetic field due to thermal expansion or changes in the susceptibility of the shield are neutralized. The system is comparatively inexpensive, since only temperature sensors, where appropriate planar heating elements and sensing electronics are required, while the remaining aspects of the system may be realized in software.

DETAILED DESCRIPTION

Figure 1:
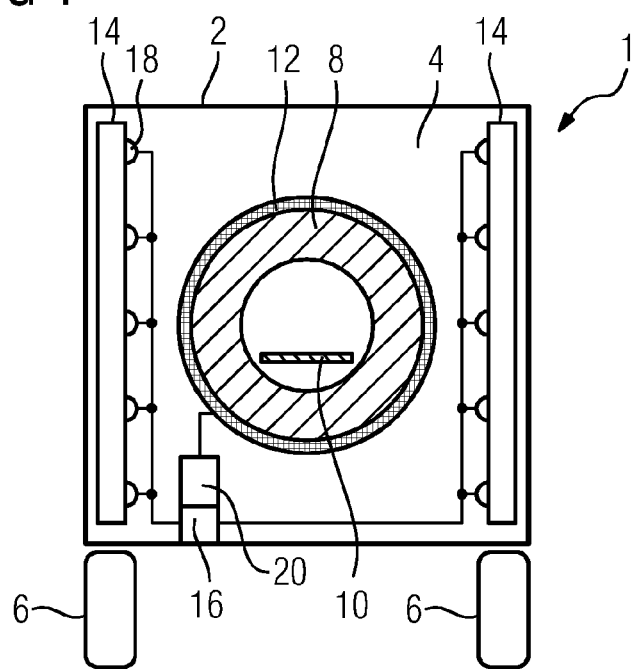
FIG. 1 depicts a section through a part of an embodiment of a mobile magnetic resonance tomography system in a trailer of a tractor-trailer unit with auxiliary coils actuated as a function of temperature.

FIG. 1 schematically depicts a cross-section through a part of a mobile magnetic resonance tomography system 1. The mobile MRT system 1 is mounted on a trailer 2 of a motorized tractor vehicle. The essentially box-shaped cargo bay 4 and the wheels 6 are depicted in the sectional view of FIG. 1. A cylinder-barrel-shaped magnet 8 and a patient support surface 10 arranged in the interior of the magnet 8 are depicted in FIG. 1. Other parts such as transmit and receive coils and the evaluation unit are not shown.

The magnet 8 serves to generate a comparatively strong homogeneous magnetic field $B_0$. In the magnetic field, previously degenerate energy levels of the atomic nuclei split up and exhibit an energy gap of $\Delta E = g\, B_0$ (in natural units). The energy gap corresponds to a frequency, also referred to as the Larmor frequency. The principle of the MRT measurement is briefly explained below.

The actual measurement is carried out according to the principle of the so-called spin echo sequence. In this context, a "sequence" (also "pulse sequence") refers to a combination of radio frequency pulses and magnetic gradient fields of specific frequency or strength that are switched on and off multiple times every second in a predetermined order. At the start stands a radio frequency pulse of the matching Larmor frequency, the so-called 90° excitation pulse. By the pulse, the magnetization is deflected through 90° at right angles to the external magnetic field and begins to gyrate around the original axis (precession).

The radio frequency signal resulting therein may be measured outside of the body. The radio frequency signal decreases exponentially because the proton spins fall out of "time" ("dephase") and increasingly destructively overlay one another. The time after which 63% of the signal has decayed is called the relaxation time (spin-spin relaxation). This time is dependent on the chemical environment of the hydrogen and is different for each tissue type. Tumor tissue, for example, may have a longer time than normal muscle tissue. For this reason, a weighted measurement represents the tumor brighter than its environment.

In order to enable the measured signals to be assigned to the individual volume elements (voxels), a spatial encoding is generated by linearly location-dependent magnetic fields (gradient fields). In this case, use is made of the fact that for a specific particle the Larmor frequency is dependent on the magnetic flux density (the stronger the field component perpendicularly to the direction of the particle angular momentum, the higher the Larmor frequency). A gradient is applied during the excitation and provides that a single slice of the body possesses the matching Larmor frequency, e.g., only the spins of the slice are deflected (slice selection gradient). A second gradient at right angles to the first is switched on briefly after the excitation and causes a controlled dephasing of the spins in such a way that the precession of the spins has a different phase position (phase-encoding gradient) in each image row. A third gradient is switched during the measurement at right angles to the two others. The third gradient provides that the spins of each image column have a different precession velocity or, in other words, send a different Larmor frequency (readout gradient, frequency encoding gradient). All three gradients together therefore effect an encoding of the signal in three spatial planes.

The measurement method described makes clear that a precise knowledge of the locally present magnetic field strength is necessary for the spatial encoding. Since the additional gradient fields are relatively weak in comparison with the underlying magnetic field $B_0$, this requires a greatest possible homogeneity of the magnetic field $B_0$. For this purpose, planar shields 14 made of iron are initially arranged on the walls of the trailer 2 in the mobile MRT system 1 according to FIG. 1 in order to prevent the residual stray field of the magnet in the exterior space of the trailer 2 from exceeding a magnitude of approximately 0.5 millitesla (mT).

Compensating for non-shielded residual stray fields is achieved by the technique known as shimming. With this, auxiliary coils 12 (also referred to as shim coils), of which a single auxiliary coil 12 encircling the magnet 8 is depicted in the exemplary embodiment of FIG. 1, are arranged at different locations in the region of the MRT system 1. The auxiliary coil 12 may also be arranged elsewhere, for example, inside a gradient coil of the MRT system 1.

The auxiliary coils 12 for the shimming are constructed such that their fields may be described in the sample by spherical harmonic functions, since interference fields whose cause lies spatially distant from the sample have in the latter likewise (approximately) the form of such low-order spherical harmonic functions. Applying electric current to the auxiliary coils 12 in a targeted manner results in correction fields being generated that overlay and homogenize the field of the magnet 8.

In mobile MRT systems 1, this, however, gives rise to the additional problem that differences in the heating-up and cooling-down of the shield 14 occur depending on meteorological conditions. Thermally insulating the shield 14 is possible to a limited extent, since the space available in the cargo bay 4 is constrained due to the permissible external dimensions of the trailer 2 under road traffic regulations. For this reason, the MRT system 1 according to FIG. 1 is designed for active compensation of the temperature differences.

For this purpose, the MRT system 1 according to FIG. 1 has a temperature measuring system 16 including a plurality of connected temperature sensors 18. In this arrangement, the temperature sensors 18 are distributed along the shield 14, with ten (merely by way of example) temperature sensors 18 being visible in FIG. 1 on account of the cross-section. In total, around fifty temperature sensors 18 are distributed, including on the floor and ceiling of the trailer 2. This enables an accurate, three-dimensional temperature distribution to be determined.

The temperature distribution is determined and evaluated by a compensation system 20. The compensation device 20 in turn controls the actuation of the auxiliary coils 12 with current. In this case, use is made of the fact that the local distribution of the temperature directly correlates with the inhomogeneity of the magnetic field corresponding thereto. Thus, for example, if a temperature gradient is present in a given spatial direction, then a field strength gradient will also be present in the same spatial direction.

Since the auxiliary coils 12 generate fields having a distribution according to spherical harmonic functions, the compensation device performs an eigenvalue analysis of the temperature distribution matrix in respect of the system of spherical harmonic functions representing the basis vectors. The determined eigenvalues are then used as a measure of the strength of the current that is to be supplied to the auxiliary coil 12 corresponding in each case to the associated spherical harmonic function. The inhomogeneities are compensated as a result.

In this case, the compensation may also be carried out continuously during a measurement. If the temperatures change during a measurement, e.g., due to strengthening sunshine, the shim of the magnet 8 may thus be constantly correctively adjusted.

The compensation system 20 is additionally connected to a frequency generator for the transmit coil of the MRT system 1. Although the compensation system 20 may restore a homogeneity of the magnetic field $B_0$ of the magnet 8, the compensation system 20 may nonetheless happen that the value of the field strength $B_0$ changes. The changes caused by the compensation system 20 in the shim currents to the auxiliary coils 12 and the measured temperature deviations are therefore used in order to determine the correction of the $B_0$ value and adjust the examination frequency, which corresponds to the changed Larmor frequency, accordingly. The adjustment may in this case be carried out in addition to a non-temperature-sensitive frequency adjustment.

Figure 2:
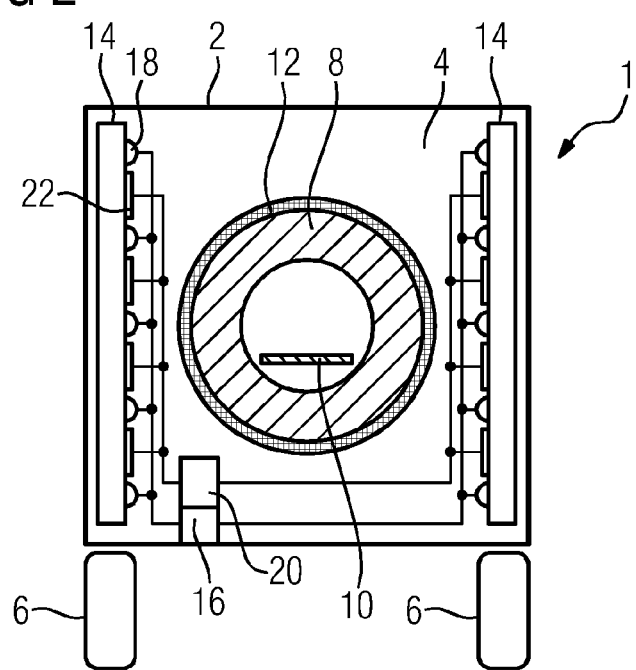
FIG. 2 depicts a section through a part of an embodiment of a mobile magnetic resonance tomography system in a trailer of a tractor-trailer unit with heating elements actuated as a function of temperature.

FIG. 2 depicts an alternative embodiment, which is explained with reference to its differences from FIG. 1. In this embodiment, the compensation system 20 does not control the shim currents to the auxiliary coils 12. Instead, the compensation system 20 has a plurality of heating elements 22 that are embodied as planar heating elements or heating foils and allocated accordingly to the temperature sensors 18.

In the exemplary embodiment according to FIG. 2, the compensation system 20 determines the highest measured temperature over all of the temperature sensors 18. The heating elements 22 are selectively actuated with current such that the temperature at all temperature sensors 18 is brought to the same value. In this case, therefore, the temperature distribution itself is homogenized. Analogously to the exemplary embodiment of FIG. 1, the examination frequency is in this case likewise adjusted to the changed B0 value.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for operating a mobile magnetic resonance tomography system having magnets, coils, or magnets and coils generating a magnetic field and a shield surrounding the magnets, the coils, or the magnets and coils, the method comprising:
measuring temperatures at a plurality of points on the shield by a temperature measuring system;
sending measured data of the temperature measuring system to a compensation system;
determining a highest measured temperature in the compensation system; and
compensating for effects of temperature differences on a homogeneity of the magnetic field by the compensation system,
wherein the temperatures are adjusted to the highest measured temperature at each point of the plurality of points.

2. The method as claimed in claim 1, wherein the temperature differences are equalized by a plurality of heating elements, cooling elements, or heating and cooling elements of the compensation system.

3. The method as claimed in claim 1, wherein a number of auxiliary coils of the compensation system are energized with electric current based on the measured temperatures.

4. The method as claimed in claim 1, wherein a frequency of a frequency generator for a transmit coil of the magnetic resonance tomography system is varied based on the measured temperatures.

5. The method as claimed in claim 1, wherein the magnetic resonance tomography system is operated during the performance of a measurement.

6. The method as claimed in claim 1, wherein the measuring of the temperatures at the plurality of points is performed by a plurality of connected temperature sensors disposed on the shield.

7. The method as claimed in claim 1, wherein the shield is positioned above, below, and on both sides of the magnets, the coils, or the magnets and the coils.

8. The method as claimed in claim 7, wherein the compensation system is configured to determine a three-dimensional temperature distribution based on the position of the shield.

9. A mobile magnetic resonance tomography system comprising:
magnets, coils, or magnets and coils for generating a magnetic field;
a shield surrounding the magnets, the coils, or the magnets and coils;
a temperature measuring system having temperature measuring sensors arranged at a plurality of points on the shield; and
a compensation system connected to the temperature measuring system, wherein the compensation system is configured to compensate for effects of temperature differences on a homogeneity of the magnetic field,
wherein the compensation system is configured to determine a highest measured temperature and adjust temperatures at each point of the plurality of points to the highest measured temperature.

10. The magnetic resonance tomography system as claimed in claim 9, wherein the compensation system comprises a plurality of heating elements, cooling elements, or heating and cooling elements.

11. The magnetic resonance tomography system as claimed in claim 10, further comprising a frequency generator for a transmit coil, wherein the frequency generator is connected to the compensation system on a measured data input side.

12. The magnetic resonance tomography system as claimed in claim 11, wherein the system is configured to compensate for the effects of temperature differences on the homogeneity of the magnetic field during performance of a measurement.

13. The magnetic resonance tomography system as claimed in claim 9, wherein the system is configured to compensate for the effects of temperature differences on the homogeneity of the magnetic field during the performance of a measurement.

14. The magnetic resonance tomography system as claimed in claim 9, wherein the compensation system comprises a number of auxiliary coils, wherein the compensation system is configured to apply an electric current to the number of auxiliary coils.

15. The magnetic resonance tomography system as claimed in claim 9, further comprising a frequency generator for a transmit coil, wherein the frequency generator is connected to the compensation system on a measured data input side.

16. The magnetic resonance tomography system as claimed in claim 9, wherein the system is configured to compensate for the effects of temperature differences on the homogeneity of the magnetic field during performance of a measurement.

17. A motorized vehicle or motorized vehicle trailer comprising:
a magnetic resonance tomography system comprising:
magnets, coils, or magnets and coils for generating a magnetic field;
a shield surrounding the magnets, the coils, or the magnets and coils;
a temperature measuring system having temperature measuring sensors arranged at a plurality of points on the shield; and
a compensation system connected to the temperature measuring system,
wherein the compensation system is configured to compensate for effects of temperature differences on a homogeneity of the magnetic field,
wherein the compensation system is configured to determine a highest measured temperature and adjust temperatures at each point of the plurality of points to the highest measured temperature.

* * * * *